United States Patent [19]
Kawamoto

[11] Patent Number: 6,153,926
[45] Date of Patent: Nov. 28, 2000

[54] SEMICONDUCTOR DEVICE

[75] Inventor: Atsunobu Kawamoto, Tokyo, Japan

[73] Assignee: Mitsubishi Denki Kabushiki Kaisha, Tokyo, Japan

[21] Appl. No.: 09/324,799

[22] Filed: Jun. 3, 1999

[30] Foreign Application Priority Data

Dec. 11, 1998 [JP] Japan .................................. 10-352556

[51] Int. Cl.⁷ ...................... H01L 23/495; H01L 23/02; H01L 23/10; H01L 23/34; H01L 23/28
[52] U.S. Cl. .......................... 257/676; 257/685; 257/706; 257/713; 257/724; 257/725; 257/782; 257/784; 257/787
[58] Field of Search .................................... 257/676, 685, 257/706, 713, 724, 725, 782, 784, 787

[56] References Cited

U.S. PATENT DOCUMENTS 5,859,387 1/1999 Gagnon .
6,069,401 5/2000 Nakamura et al. .
6,084,780 7/2000 Happoya .

FOREIGN PATENT DOCUMENTS 3-92052 9/1991 Japan .

*Primary Examiner*—David E. Graybill
*Attorney, Agent, or Firm*—Oblon, Spivak, McClelland, Maier & Neustadt, P.C.

[57] ABSTRACT

A semiconductor device that be able to be manufactured in same equipment dose not depend on a number of semiconductor chips which are mounted on the semiconductor device.

The semiconductor device can be prepared by a method comprising a step of mounting a semiconductor chip 2 having a first electrode and a second electrode on both sides on a common substrate 20 having N chip areas 8 having a first wiring area 9a and a second wiring area 9a insulated from the first wiring area 9a and separating areas 7 separating adjacent chip areas 8, a step of connecting the first wiring area 9a and first electrode, a step of mounting semiconductor chips 2 on the chip mounting areas 8 of the common substrate 9, a step of connecting the second wiring area 9b and the second electrode of semiconductor chip 2 electrically, and a step of removing extra area 8b which is chip area 8 having no semiconductor chip 2.

8 Claims, 8 Drawing Sheets

SEMICONDUCTOR DEVICE

BACKGROUND OF THE INVENTION

1. Field of the Invention

The present invention relates to a semiconductor device having N or less pieces of semiconductor chips, more particularly to power semiconductor chips, mounted on a common substrate capable of mounting N pieces of semiconductor chips.

2. Description of the Related Art

First, reference will be made to FIG. 9 for the description of a sealed semiconductor device 30 of the prior art. The semiconductor device 30 comprises four power semiconductor chips 2 mounted on a lead frame 25 which is a common substrate, and sealed together by means of a molding resin 5. Each of the four semiconductor chips has electrodes on the front and back sides thereof. Hereinafter in this specification, an electrode formed on a surface of the semiconductor chip which makes contact with the common substrate will be referred to as back electrode (first electrode) and an electrode formed on a surface of the semiconductor chip opposite to the contact surface will be referred to as front electrode (second electrode). The back electrode of each semiconductor chip 2 is electrically connected to a back electrode lead 3c via a wiring pattern formed on the surface of the lead frame 25, and the front electrode is connected to a front electrode lead 3d via a wire bonding 4. The back electrode lead 3c and the front electrode lead 3d are sealed together with the molding resin 5, but are electrically insulated from each other.

The semiconductor device 30 of the prior art has such problems as described below. That is, the number of semiconductor chips 2 which can be mounted on the semiconductor devices 30 varies depending on the application of the semiconductor device 30. For example, besides the semiconductor device having four semiconductor chips 2 mounted thereon as shown in FIG. 9, there is a semiconductor device having three power semiconductor chips mounted on a lead frame. Because the lead frame of such a semiconductor device is designed in accordance to the number of semiconductor chips mounted thereon, it is necessary to design the lead frame of the semiconductor device having three semiconductor chips 2 mounted thereon and the lead frame of the semiconductor device having four semiconductor chips 2 mounted thereon separately, there has been a problem of a high development cost. Further, when producing the semiconductor device having three semiconductor chips 2 mounted thereon and the semiconductor device having four semiconductor chips 2 mounted thereon, it is necessary to change the production apparatuses used in the production line in accordance to the lead frame dimensions, and therefore different production lines must be prepared for the semiconductor device having three semiconductor chips 2 mounted thereon and for the semiconductor device having four semiconductor chips 2 mounted thereon. This leads to increased production cost for the semiconductor device.

Further, in the case of the semiconductor device 30 is used with a high voltage at a high temperature, the semiconductor device 30 needs to be connected to an external heat sink. Since the semiconductor chip 2 has the electrodes provided on the front and back sides thereof and the lead frame 25 is electrically conductive, the back electrode of the semiconductor chip 2 needs to be insulated from an external heat sink. In the prior art, the external heat sink and the lead frame 25 are put into contact via an insulation layer and the semiconductor device 30 is connected to the external heat sink with the lead frame 25 being fastened onto the external heat sink with a screw. Therefore the lead frame 25 has a screw hole 6 formed therein. At present, in order to produce the semiconductor device at a lower cost, there is a demand for eliminating the insulation film provided between the lead frame and the external heat sink thereby reducing the material cost.

SUMMARY OF THE INVENTION

The present invention has been accomplished in consideration of the problems described above, and it is an object to provide a semiconductor device which can be produced in a same production line regardless of the number of semiconductor chips mounted thereon.

It is another object of the present invention to provide a semiconductor device which can be directly connected to the external heat sink without providing the insulation film between the external heat sink and the lead frame which is necessary in the prior art.

In order to attain the objects described above, production process is proceeded in the state of a semiconductor device member comprising a desired number of semiconductor chips mounted on a common substrate of which dimension can be easily changed, while an unnecessary portion of the common substrate is cut off in the last stage of the production process to obtain the common substrate of the desired dimensions, and the semiconductor device of the present invention comprising the desired number of semiconductor chips mounted on the common substrate is completed.

Specifically, the present invention provides a semiconductor device having N pieces or less of a semiconductor chip mounted on a common substrate capable of being mounted N pieces of the semiconductor chip, which comprises: the semiconductor chip having a first electrode formed on a first side thereof and a second electrode formed on a side opposite to the first side, the common substrate with separated N chip mounting regions having a first wiring area whereto the first electrode is electrically connected and a second wiring area which is electrically connected to the second electrode and is insulated from the first wiring area and, separating portions to separate the adjacent chip mounting regions, up to N pieces of the semiconductor chip mounted in the first wiring area on the region so that the first wiring area and the first electrode of the semiconductor chips make contact with each other, the second electrode of the semiconductor chips and the second wiring portion are electrically connected with each other and, a redundant region which is the chip mounting region whereon no semiconductor chip mounted is cut off the separating area.

Thus because the semiconductor devices of the present invention whereon up to n semiconductor chips are mounted can be produced in the same production line and the production apparatuses can be used in common regardless of the number of semiconductor chips mounted thereon, thereby making it possible to reduce the production cost of the semiconductor device.

The semiconductor device of the present invention is subjected to the production processes in the state of a desired number of semiconductor chips mounted on the general-purpose common substrate with the unnecessary portion of the general-purpose common substrate being cut off in the final stage of the production process to be completed. Because the semiconductor device can be produced in the production process designed for the general-purpose common substrate up to the final stage regardless of the number of semiconductor chips to be mounted, it becomes unnecessary to prepare the production line in accordance to the number of semiconductor chips to be mounted, thereby making it possible to reduce the production cost of the semiconductor device.

In the semiconductor device of the present invention, it is preferable that the common substrate is an insulating thick film substrate.

In the semiconductor device of the present invention, the back electrode of the semiconductor chip and the common substrate can be easily insulated by employing the insulating general-purpose thick film substrate for the general-purpose common substrate.

In the semiconductor device of the present invention, it is preferable that the separating area is a scribe line and, cutting off across the scribe line to separate a useful portion whereon the semiconductor chips are mounted and the redundant portion which is one or more chip mounting regions adjacent to the useful portion, so that only the useful portion which is a part of the insulating thick film substrate is used as the common substrate.

By separating the substrate along the scribe line, the useful portion and the redundant portion can be easily separated.

In the semiconductor device of the present invention, since the useful portion and the redundant portion are separated from each other by the scribe line, the useful portion and the redundant portion can be easily separated.

In the semiconductor device of the present invention, it is preferable that the insulating thick film is bonded onto an external heat sink by means of an adhesive.

Thus the semiconductor device can be bonded onto the external heat sink without providing an insulating film between the external heat sink and the thick film substrate as in the prior art.

In the semiconductor device of the present invention, since the insulating thick film substrate is directly bonded onto the external heat sink by the adhesive, the insulation layer of the prior art provided between the external heat sink and the substrate can be omitted.

In the semiconductor device of the present invention, it is preferable that the common substrate is a conductive heat sink, the separating area is a fine wire portion connecting the adjacent chip mounting regions and, cutting off the fine wire portion which connects the useful portion whereon the semiconductor chips are mounted and the redundant portion which is one or more the chip mounting regions adjacent to the useful portion thereby separating the useful portion and the redundant portion, so that only the useful portion which is a part of the heat sink is used as the common substrate.

By separating the substrate across the fine wire portion, the useful portion and the redundant portion can be easily separated and, the dimensions of the common substrate can be easily changed.

The semiconductor device of the present invention is subjected to the production processes in the state of a desired number of semiconductor chips mounted on the general-purpose heat sink with the unnecessary portion of the general-purpose heat sink being cut off in the final stage of the production process to be completed. Because the semiconductor device can be produced in the production process designed for the general-purpose heat sink up to the final stage regardless of the number of semiconductor chips to be mounted, it becomes unnecessary to prepare the production line in accordance to the number of semiconductor chips to be mounted, thereby making it possible to reduce the production cost of the semiconductor device.

In the semiconductor device of the present invention, it is preferable that the first and second wiring portions are wiring patterns formed on the chip mounting region of the heat sink via an insulating film.

This configuration makes it possible to omit a process of coating the heat sink with an adhesive that is required in case the insulator is bonded at a predetermined position of the heat sink by means of the adhesive, then the first and second wiring layers are formed on the insulator.

In the semiconductor device of the present invention, since the semiconductor chips are arranged on the wiring pattern formed on insulation film, it is possible to omit a process of coating the heat sink with an adhesive that is required in case the thick film substrate is bonded at a predetermined position of the heat sink by means of the adhesive.

In case the semiconductor device of the present invention is used under a high voltage at a high temperature, it is preferable that at least one of the separating area which separate the chip mounting region adjacent the useful portion comprises a plurality of fine lines, a region between the fine lines is a screw hole and, connecting the common substrate onto the external heat sink by means of a screw.

Thus the common substrate can be connected to the external heat sink without using the insulating film unlike the prior art. Also it is made possible to omit a process of making the screw hole in the common substrate of the semiconductor device.

In the semiconductor device of the present invention, since a plurality of fine lines are provided in at least one of portions of the heat sink connecting the occupied chip mounting regions whereon the semiconductor chips are mounted and a portion across by the fine lines is used as a screw hole to secure the heat sink onto the external heat sink with the screw, a process of making a screw hole in the heat sink can be omitted.

The present invention provides another semiconductor device having N pieces or less of semiconductor chip mounted on a common substrate capable of being mounted N pieces of semiconductor chip: wherein the semiconductor chip having a first electrode formed on a first side thereof and a second electrode formed on a side opposite to the first side, the common substrate with separated N chip mounting regions having a first wiring area whereto the first electrode is electrically connected and, separating portions to separate the adjacent chip mounting regions, up to N pieces of the semiconductor chip are mounted in the first wiring area on the region so that the first wiring area and the first electrode make contact with each other, a second wiring portion which is electrically connected to the second electrode of said semiconductor chip formed separately from the chip mounting region, the semiconductor chip and the second wiring portion whereto the semiconductor chip is connected are sealed as a block of one chip mounting region by molding on the chip mounting region whereon said semiconductor chip is mounted; and, a redundant region which is a chip mounting region whereon no semiconductor chip is mounted cut off via said separating area.

Thus because the semiconductor devices of the present invention whereon up to n semiconductor chips are mounted can be produced in the same production line and the production apparatuses can be used in common regardless of the number of semiconductor chips mounted thereon, production cost for the semiconductor device can be reduced.

In the semiconductor device of the present invention, the semiconductor chip and the second wiring portion connected to the semiconductor chip are sealed by molding in a block of each chip mounting region, while the production processes is proceeded in the state of a desired number of semiconductor chips mounted on the general-purpose common substrate, and unnecessary portion of the general-purpose common substrate is cut off in the final stage of the production process. Thus because the semiconductor device can be produced in the production process designed for the general-purpose common substrate up to the final stage regardless of the number of semiconductor chips to be mounted, it becomes unnecessary to prepare the production line in accordance to the number of semiconductor chips to be mounted, thereby making it possible to reduce the production cost of the semiconductor device.

DESCRIPTION OF THE PREFERRED EMBODIMENTS

Figure 1:
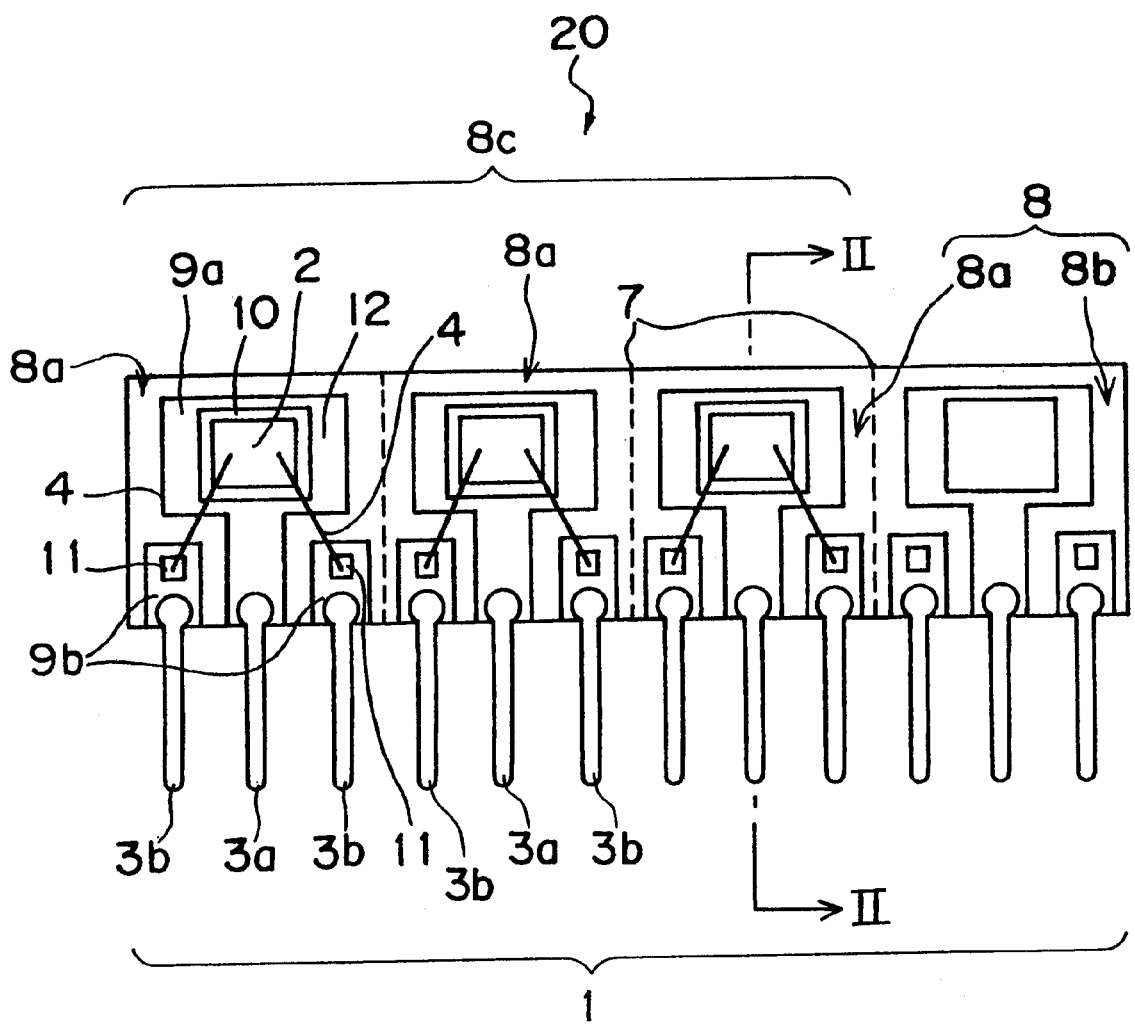
FIG. 1 shows a semiconductor device member produced in the production process for the semiconductor device according to the first embodiment of the present invention.

Now preferred embodiments of the present invention will be described below with reference to the accompanying drawings.

Embodiment 1

First a semiconductor device according to the first embodiment of the present invention will be described below with reference to FIG. 1 through FIG. 3. The semiconductor device of this embodiment comprises three power semiconductor chips mounted on an insulating thick film substrate which is a common substrate. In the semiconductor device production process, the thick film substrate is made by changing the dimension of a general-purpose thick film substrate suitable for four semiconductor chips to the dimension suitable for three semiconductor chips. The power semiconductor chip 2 has electrodes on the front and back sides thereof, as described previously.

To produce the semiconductor device, three power semiconductor chips 2 are mounted on an chip mounting region 8 of the general-purpose thick film substrate 1 which is made to accommodate four semiconductor chips, and then necessary wiring is made for each of the semiconductor chips 2. Then the semiconductor chips are protected by covering with a silicon resin 12 (not shown in FIG. 1) thereby completing the semiconductor device member 20 shown in FIG. 1.

The general-purpose thick film substrate 1 is made to such dimensions that accommodate four semiconductor chips with four chip mounting regions 8 provided thereon, and the semiconductor chips 2 are mounted in the three chip mounting regions 8a except for the chip mounting region 8b located at the end on the right-hand side. Hereafter the chip mounting region 8 whereon the semiconductor chip 2 is mounted will be referred to as an occupied chip mounting region 8a, a portion comprising three consecutive occupied chip mounting regions 8a as a useful portion 8c and the chip mounting region 8 whereon the semiconductor chip 2 is not mounted as an empty chip mounting region (redundant region) 8b. The useful portion 8c has the same dimensions as the thick film substrate which accommodates three semiconductor chips.

The four chip mounting regions 8 are formed consecutively in the longitudinal direction of the general-purpose thick film substrate 1, and adjacent chip mounting regions 8 are separated from each other by a scribe line (separating area) 7. Each of the chip mounting regions 8 has a wiring pattern 9a (first wiring portion) for the chip provided at the center and two lead wiring patterns 9b (second wiring portion) located at the edge. The chip wiring pattern 9a corresponds to the back electrode (first electrode) of the semiconductor chip 2 and is electrically connected to the back electrode lead 3a. On the other hand, the front electrode wiring pattern 9b corresponds to the front electrode (second electrode) of the semiconductor chip 2 and is electrically connected to the back electrode lead 3b. Both the chip wiring pattern 9a and the front electrode wiring pattern 9b are formed by solder printing.

Figure 2:
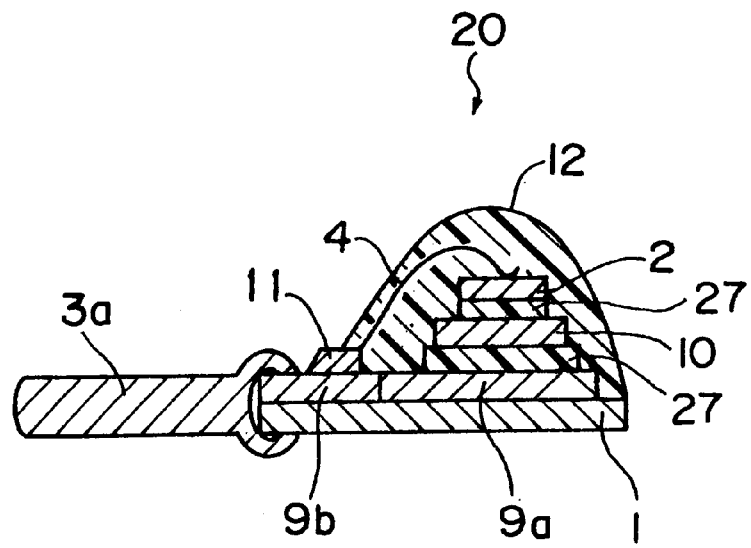
FIG. 2 is a cross sectional view taken along lines II—II of the semiconductor device member shown in FIG. 1.
Figure 3:
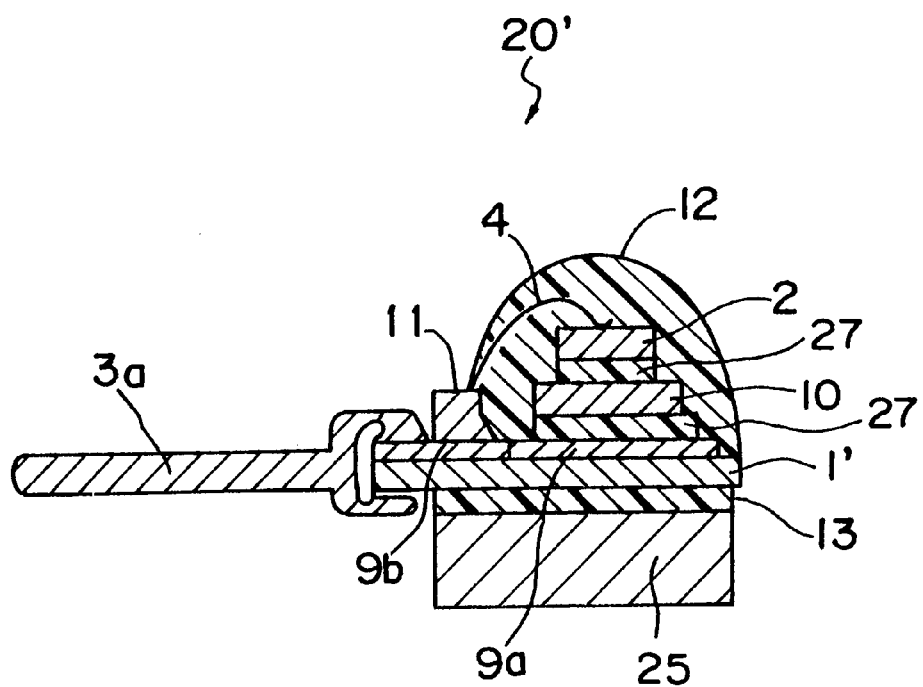
FIG. 3 is a cross sectional view showing a secondary semiconductor device member produced in the production process for the semiconductor device according to the first embodiment of the present invention being connected to an external heat sink.

As shown in FIG. 1 and FIG. 2, the semiconductor chip 2 is secured by solder 27 on a primary heat sink 10 located on the chip wiring pattern 9a. This causes the back electrode of the semiconductor chip 2 to be connected to the chip wiring pattern 9a. The front electrode (not shown) of the semiconductor chip 2 is electrically connected to the front electrode wiring pattern 9b via a bonding wire 4. The bonding wire 4 and the front electrode wiring pattern 9b are electrically connected to each other via an Al base 11, while the front electrode of the semiconductor chip 2 and an external device are electrically connected to each other by a front electrode lead 3b which is connected to the front electrode wiring pattern 9b.

After the completion of the semiconductor device member 20, the useful portion 8c and the redundant portion 8b are cut off along the scribe line 7, to separate the redundant portion 9b whereon the semiconductor chip 2 is not mounted from the general-purpose thick film substrate 1, thereby making a secondary semiconductor member having the useful portion 8c of the general-purpose thick film substrate 1. Applying a predetermined treatment to this secondary semiconductor device member completes the semiconductor device of this embodiment.

The process described above is for producing the semiconductor device having three semiconductor chips 2 mounted thereon, wherein only the three occupied chip mounting regions 8a of the general-purpose thick film substrate 1 are used while the redundant portion 8b is separated therefrom. Therefore, although the semiconductor chip 2 is not mounted on the redundant portion 8b in the above description, the semiconductor chip 2 may otherwise be mounted on the redundant portion 8b.

The semiconductor device may also be produced by the same method as described above, wherein a semiconductor preliminary member is made by mounting four semiconductor chips on the general-purpose thick film substrate which accommodates four semiconductor devices, and making the semiconductor device with four semiconductor chips 2 mounted thereon from the semiconductor preliminary member. In this case, since the general-purpose thick film substrate does not include the redundant portion, the process of cutting off the redundant portion from the thick film substrate is eliminated.

In case the semiconductor device is used under a high voltage at a high temperature, it is necessary to connect an external heat sink to the semiconductor device. Specifically, the secondary semiconductor member of the semiconductor device is connected to the external heat sink in the production process. Since the semiconductor chip mounted on the secondary semiconductor member is a power semiconductor chip, an electrode is provided also on the back side thereof, but the back electrode of the semiconductor chip and the back side of the thick film substrate (the surface making contact with the external heat sink) are insulated from each other because the thick film substrate is an insulator. As a result, as shown in FIG. 3, a secondary semiconductor member 20' can be connected to the external heat sink 25 by bonding the thick film substrate 1' of the secondary semiconductor member 20' onto the external heat sink 25 by means of the adhesive 13.

The semiconductor device of this embodiment has three semiconductor chips mounted thereon but is produced by mounting the three semiconductor chips on the general-purpose thick film substrate of such dimensions that accommodate four semiconductor chips. Consequently, even in the case of using production apparatuses which need to be changed according to the dimensions of the thick film substrate are used to produce the semiconductor device, the semiconductor device of this embodiment can be produced by means of the production apparatuses designed for a thick film substrate which accommodates four semiconductor chips mounted thereon without changing to production apparatuses designed for a thick substrate which accommodates three semiconductor chips mounted thereon.

In this embodiment, the semiconductor device having three semiconductor chips 2 mounted thereon is produced by using the general-purpose thick film substrate designed for four semiconductor chips, but the present invention is not limited to this scheme. For example, the semiconductor device can be produced with production apparatuses designed for a thick film substrate suitable for n semiconductor chips, by mounting any number of semiconductor chips, from one to N pieces, on a general-purpose thick film substrate suitable for n semiconductor chips. That is, since a semiconductor device having any number of semiconductor chips, from one to N pieces, mounted thereon can be produced by means of production apparatuses designed for a semiconductor device having n semiconductor chips mounted thereon, the production apparatuses can be used in common and the production cost for the semiconductor device can be reduced.

Embodiment 2

A semiconductor device according to the second embodiment of the present invention will be described below with reference to FIG. 4. The semiconductor device of this embodiment comprises three power semiconductor chips mounted on an electrically conductive heat sink (common substrate). In the semiconductor device production process, the heat sink is made by changing the dimension of a general-purpose heat sink suitable for four semiconductor chips to the dimension suitable for three semiconductor chips.

According to this embodiment, the semiconductor device is produced by mounting three power semiconductor chips 2 on an chip mounting region 14 of the general-purpose heat sink 15, followed by connection of a front electrode (second electrode) of the semiconductor chip 2 to a front electrode lead 3d (second wiring portion) via the bonding wire 4. Then for the protection of the semiconductor chips 2, the semiconductor chips 2 and the front electrode lead 3c connected to the semiconductor chip 2 are sealed by molding in a block of each chip mounting region 14 whereon the semiconductor chips 2 are mounted, thereby making a semiconductor device member 21.

Since the general-purpose heat sink 15 has dimensions for mounting four semiconductor chips, it has four chip mounting regions 14 and each of the chip mounting regions 14 has the back electrode lead 3c. The semiconductor chips 2 are mounted in the three chip mounting regions 14a except for the chip mounting region 14b located at the end on the right-hand side. Chip wiring patterns (first wiring portion) corresponding to the back electrode (first electrode) of the semiconductor chip 2 are formed on the three chip mounting regions 14a respectively. That is, the back electrode of the semiconductor chip 2 and the chip wiring pattern are electrically connected by mounting the semiconductor chip 2 on the chip mounting region 14a. Hereafter the chip mounting region 14 whereon the semiconductor chip 2 is mounted will be referred to as an occupied chip mounting region 14a, a portion comprising three consecutive occupied chip mounting regions 14a as a useful portion 16 and the chip mounting region 14 whereon the semiconductor chip 2 is not mounted as an empty chip mounting region (redundant region) 14b. The useful portion 16 has the same dimensions as the heat sink designed for three semiconductor chips.

The four chip mounting regions 14 are formed consecutively in the longitudinal direction of the general-purpose heat sink 15, and adjacent chip mounting regions 14 are connected by two fine lines 14c.

Upon completion of the semiconductor device member 21, the redundant portion 14b is cut off across the fine line 14c at the position of dashed line 15a, to separate the redundant portion 14b from the general-purpose heat sink 15, thereby making a secondary semiconductor member having the heat sink 16 whereon the three semiconductor chips 2 are mounted. Applying a predetermined treatment to this secondary semiconductor device member completes the semiconductor device of this embodiment.

Figure 4:
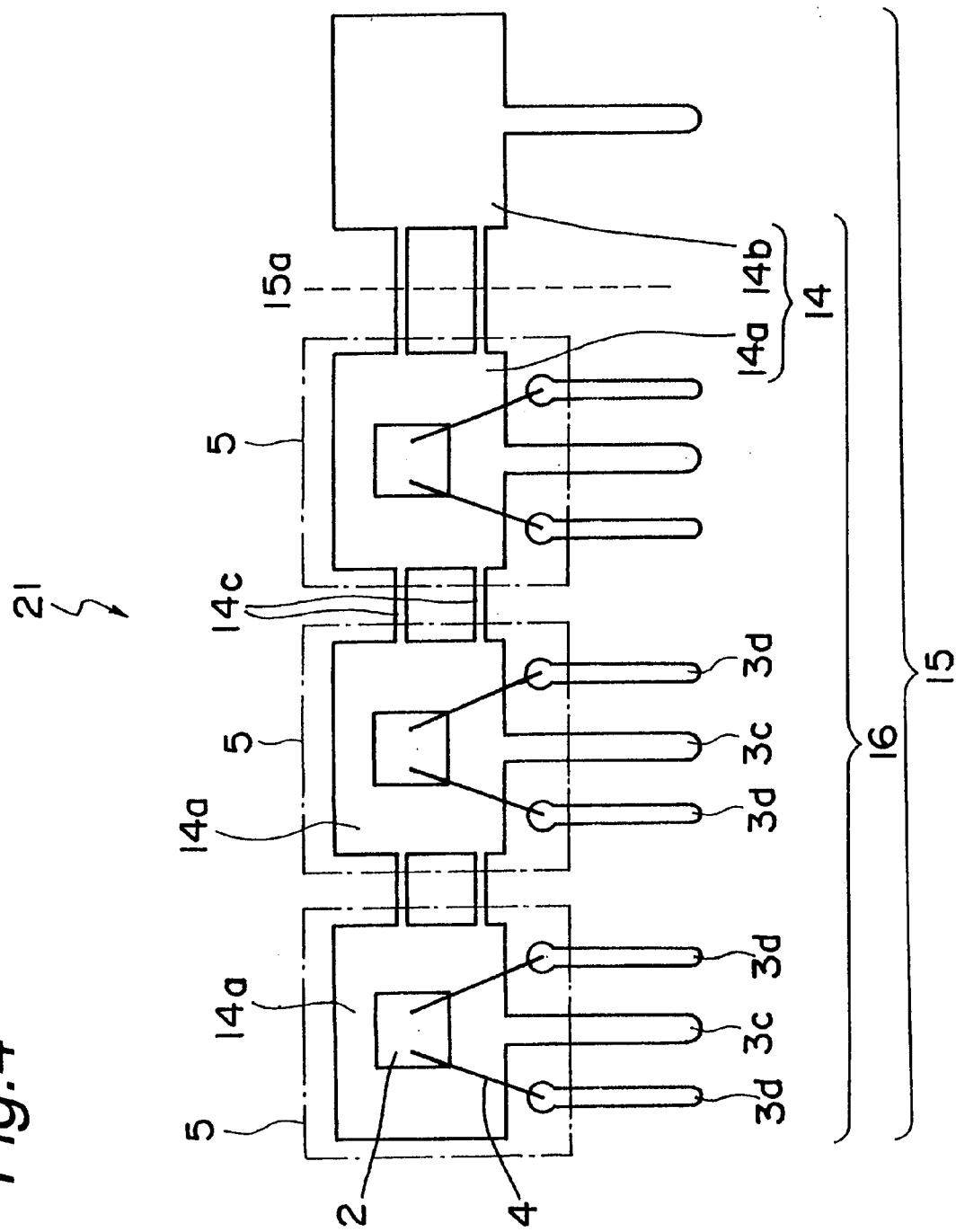
FIG. 4 shows a semiconductor device member produced in the production process for the semiconductor device according to the second embodiment of the present invention.

The process described above is for producing the semiconductor device having three semiconductor chips 2 mounted thereon, wherein only the three occupied chip mounting regions 14a of the general-purpose heat sink 15 shown in FIG. 4 are used while the redundant portion 14b is separated therefrom. Therefore, although the semiconductor chip 2 is not mounted on the redundant portion 14b in the above description, the semiconductor chip may be mounted on the redundant portion 14b.

The semiconductor device may also be produced by the same method as described above, wherein a semiconductor preliminary member is made by mounting four semiconductor chips on the general-purpose heat sink which accommodates four semiconductor chips, and making the semiconductor device with four semiconductor chip 2 mounted thereon from the semiconductor preliminary member. In this case, since the general-purpose heat sink does not include the redundant portion, the process of cutting off the redundant portion from the general-purpose heat sink is eliminated.

The semiconductor device of this embodiment has three semiconductor chips mounted thereon but is produced by mounting the three semiconductor chips on the general-purpose heat sink of such dimensions that accommodate four semiconductor chips. Consequently, even in the case of using producing apparatuses which need to be changed according to the dimension of the heat sink to produce the semiconductor device, the semiconductor device of this embodiment can be produced by means of the production apparatuses designed for semiconductor device having four semiconductor chips mounted thereon without changing to production apparatuses designed for semiconductor device having three semiconductor chips mounted thereon.

In this embodiment, the semiconductor device having three semiconductor chip 2 mounted thereon is produced by using the heat sink designed for four semiconductor chips, but the present invention is not limited to this scheme. The semiconductor device can also be produced with production apparatuses designed for the heat sink suitable for n semiconductor chips, by mounting any number of semiconductor chips, from one to N pieces, on a general-purpose heat sink made for accommodating n semiconductor chips. That is, the semiconductor device having any number of semiconductor chips, from one to N pieces, mounted thereon is produced with the production apparatuses designed for the semiconductor device having n semiconductor chips mounted thereon. Thus the production apparatuses can be used in common and the production cost for the semiconductor device can therefore be reduced.

Embodiment 3

A semiconductor device according to the third embodiment of the present invention will be described below with reference to FIG. 5 through FIG. 7.

The semiconductor device of this embodiment comprises three power semiconductor chips mounted on a heat sink (common substrate) via a thick film substrate. In the semiconductor device production process, the heat sink is made by changing the dimension of a general-purpose heat sink suitable for four semiconductor chips to the dimension suitable for three semiconductor chips.

Figure 5:
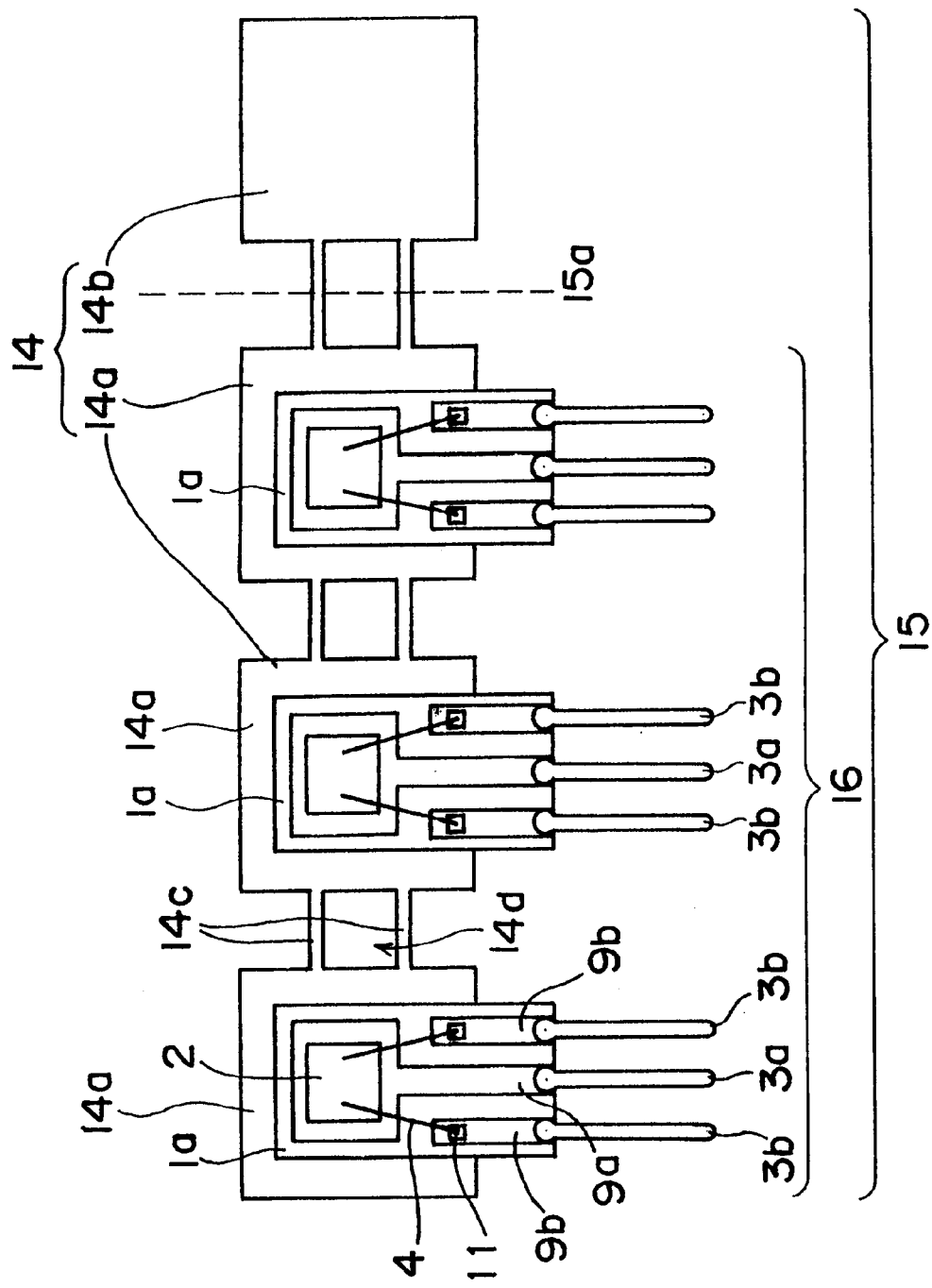
FIG. 5 shows a semiconductor device member produced in the production process for the semiconductor device according to the third embodiment of the present invention.

According to this embodiment, the semiconductor device is produced by mounting three power semiconductor chips 2 on respective insulating thick film substrates 1a and the thick film substrates 1a are bonded on the general-purpose heat sink 15 with an adhesive, thereby making a semiconductor device member 22 shown in FIG. 5.

The thick film substrate 1a formed on the chip mounting regions 14a has the chip wiring pattern 9a (first wiring portion) provided at the center and two lead wiring patterns 9b (second wiring portion) located at the edge. The chip wiring pattern 9a corresponds to the back electrode (first electrode) of the semiconductor chip 2 and has the back electrode lead 3a. On the other hand, the front electrode wiring pattern 9b corresponds to the front electrode (second electrode) of the semiconductor chip 2 and has the front electrode lead 3b. The semiconductor chip 2 is placed on the chip wiring pattern 9a so that the back electrode of the semiconductor chip 2 is connected to the chip wiring pattern 9a. The front electrode (not shown) of the semiconductor chip 2 is electrically connected to the front electrode wiring pattern 9b via a bonding wire 4. The bonding wire 4 and the lead wiring pattern 9b are electrically connected to each other via the Al base 11. For the protection of the semiconductor chips 2, the semiconductor chips 2 are covered by a silicon resin (not shown in FIGS. 5 and 6).

The four chip mounting regions 14 of the general-purpose heat sink 15 is connected to the adjacent chip mounting region 14 by two fine wires 14c. As will be described later, a portion 14d between the two fine lines 14c is used as a screw hole.

Upon completion of the semiconductor device member 22, by cutting off across the fine line 14c at the position of dashed line 15a, the redundant portion 14b whereon the semiconductor chip 2 not mounted is separated from the general-purpose heat sink 15, thereby making a secondary semiconductor member having the heat sink (common substrate) 16 whereon three semiconductor chips 2 are mounted. The thick film substrate 1a may also be mounted on the redundant portion 14b.

Figure 6:
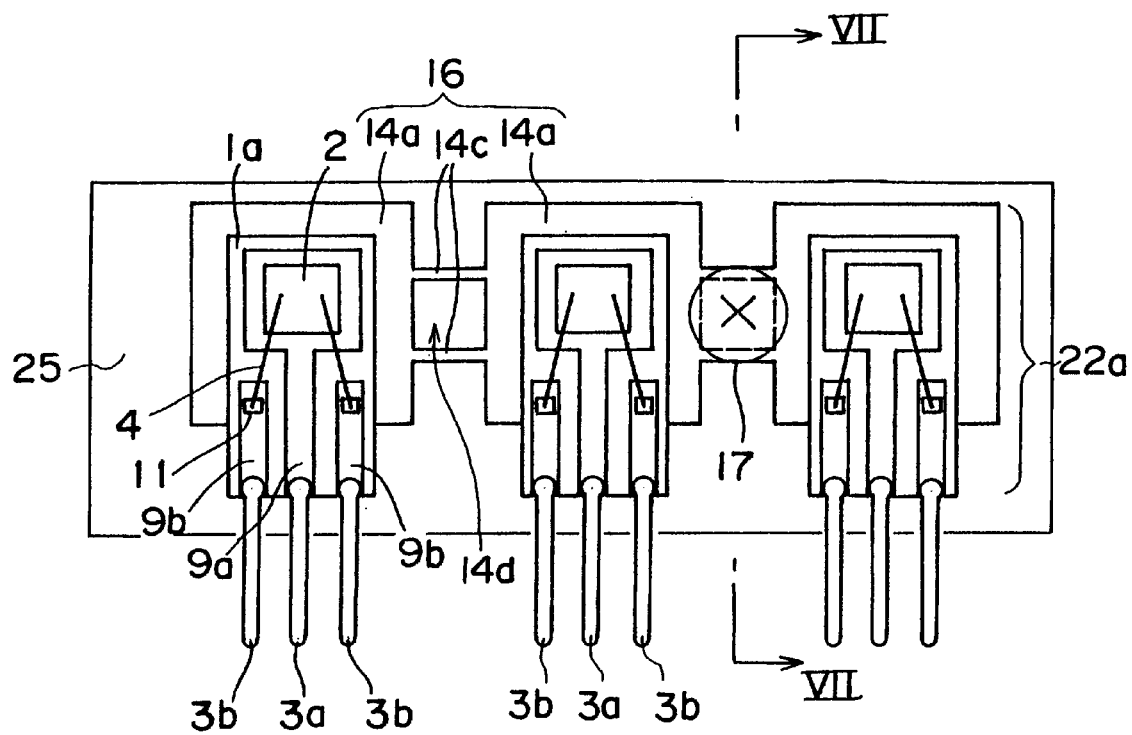
FIG. 6 shows the secondary semiconductor device member produced in the production process for the semiconductor device according to the third embodiment of the present invention being connected to the external heat sink.

Then the secondary semiconductor member 22a is connected to the external heat sink 25 as shown in FIG. 6. At this time, by using portion 14d between the two fine lines 14c as a screw hole, the heat sink 16 of the secondary semiconductor device member 21a is fastened onto the external heat sink 25 with the screw 17.

Figure 7:
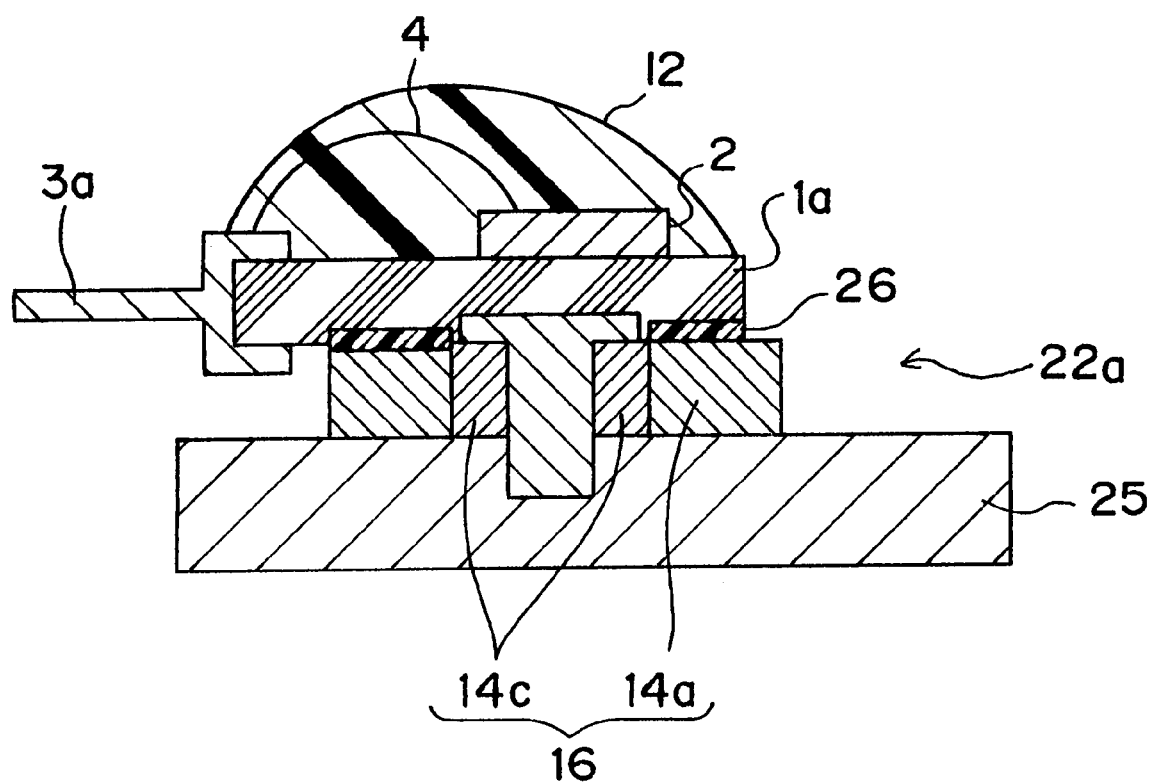
FIG. 7 is a cross sectional view taken along lines VII—VII of the secondary semiconductor device member shown in FIG. 6.

Because the back electrode of the semiconductor chip 2 and the back side (surface opposing the external heat sink 25) of the heat sink 16 are insulated from each other as described previously, the heat sink 16 of the secondary semiconductor device member 21a can be fastened directly onto the external heat sink 25 as shown in FIG. 7. The thick film substrate 1a is bonded onto the heat sink 16 with the adhesive 26 as described above, and the semiconductor chip 2 is covered by the silicon resin 12. By applying predetermined processes to the secondary semiconductor device member 22a, the semiconductor device of this embodiment is completed.

The semiconductor device of this embodiment can also be used without connecting to the external heat sink.

Embodiment 4

In the semiconductor device of the third embodiment, the back electrode of the semiconductor chip is electrically insulated from the back surface of the heat sink by means of the insulating thick film substrate. Since the thick film substrate of the semiconductor device of the third embodiment is bonded onto the heat sink which is the common substrate with the adhesive as described above, it is necessary to include a step of coating the heat sink with the adhesive in the production processes. The semiconductor device of the fourth embodiment is an improved variation of the semiconductor device of the third embodiment in order to eliminate the adhesive coating step. Specifically, the semiconductor chips are mounted on a wiring pattern formed on the surface of the general-purpose heat sink via an insulating film. Now the semiconductor device of the fourth embodiment will be described below in more detail with reference to FIG. 8.

Similarly to the third embodiment, the semiconductor device of this embodiment comprises three power semiconductor chips mounted on a heat sink (common substrate). In the semiconductor device production process, the heat sink is made by changing the dimension of a general-purpose heat sink stable for four semiconductor chips to the dimension for three semiconductor chips.

Figure 8:
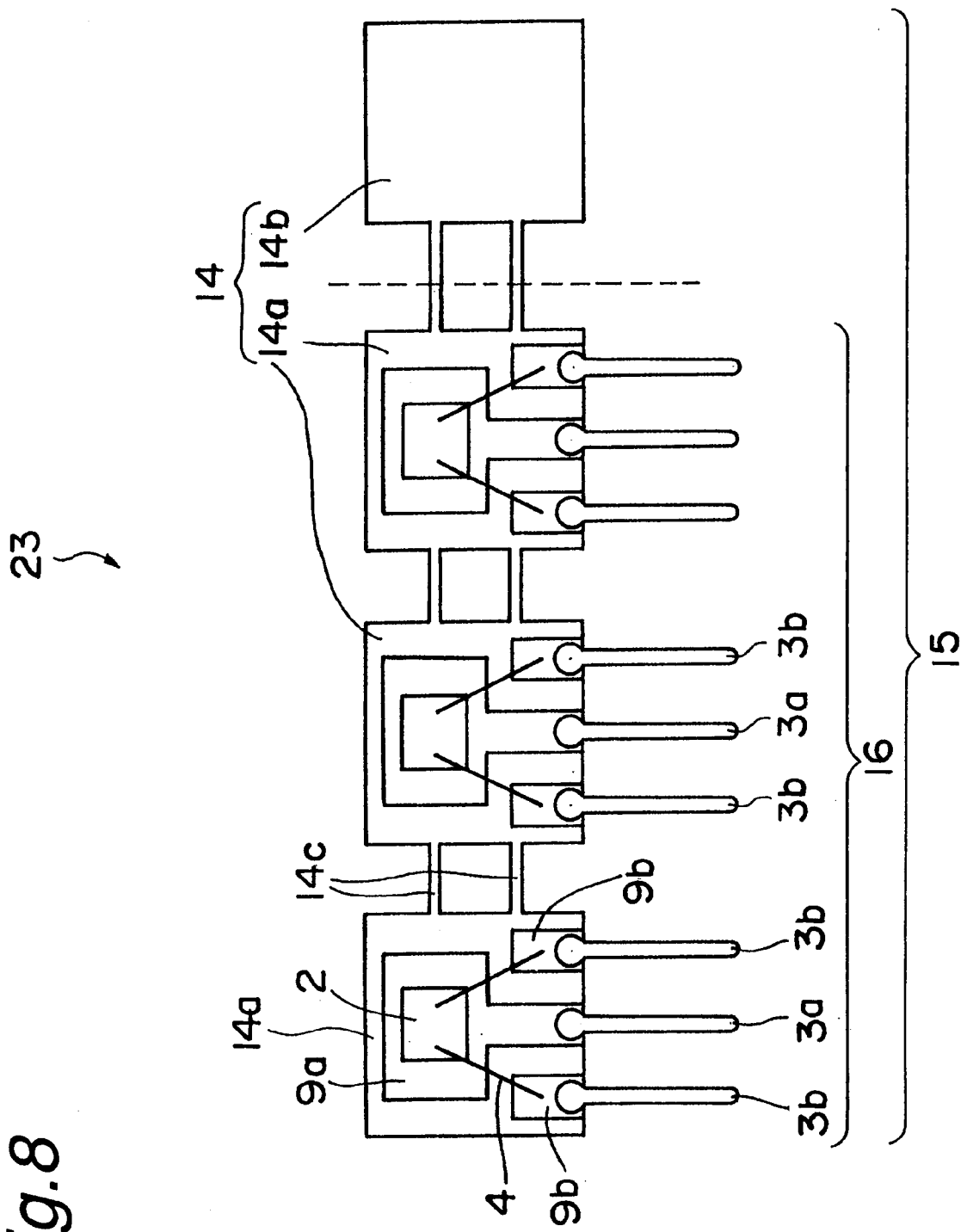
FIG. 8 shows a semiconductor device member produced in the production process for the semiconductor device according to the fourth embodiment of the present invention.
Figure 9:
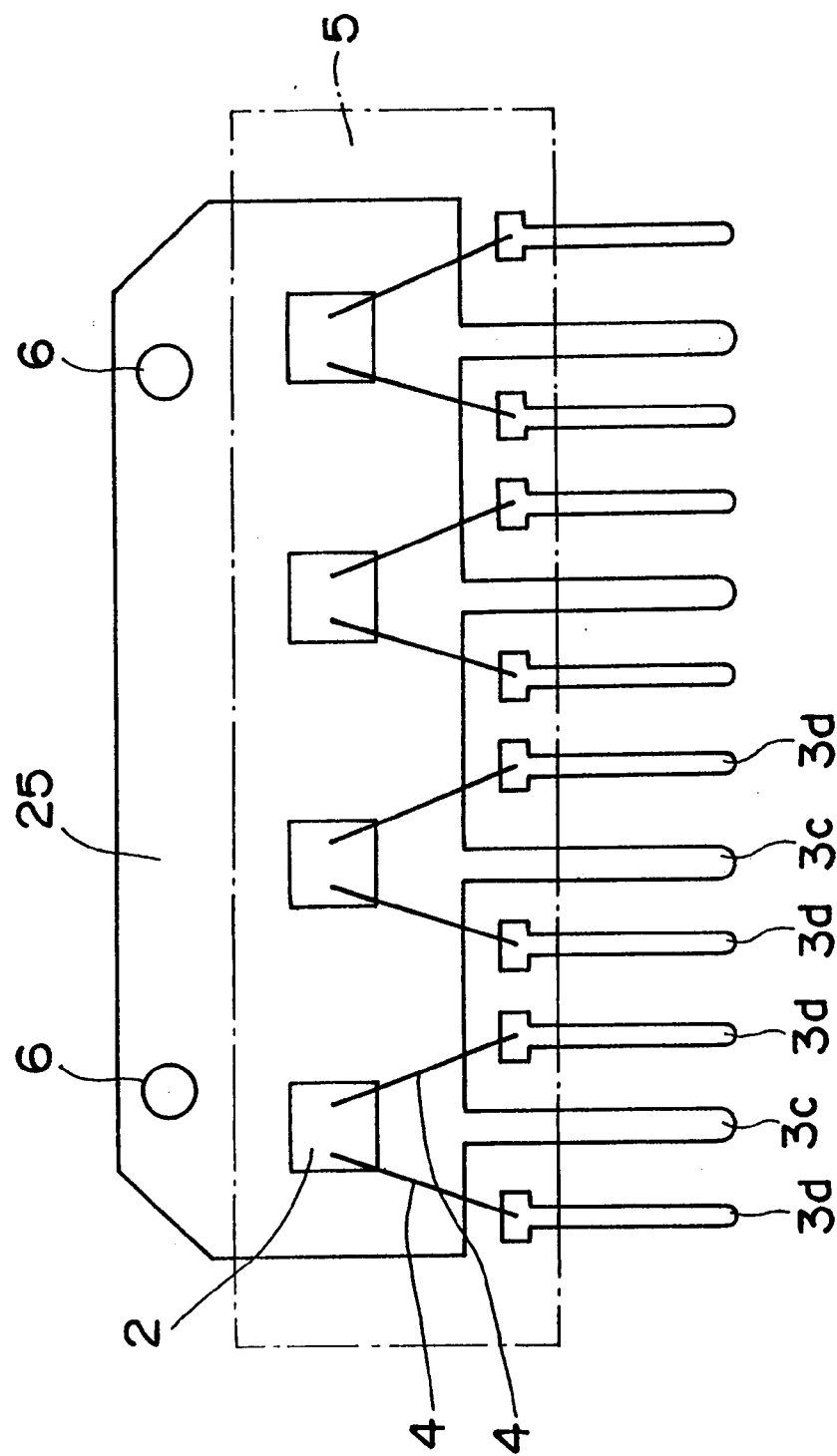
FIG. 9 shows the semiconductor device of the prior art.

The semiconductor device of this embodiment is produced by mounting the three power semiconductor chips 2 on the chip mounting region 14 of the general-purpose heat sink 15, thereby making the semiconductor device member 23 shown in FIG. 8. The chip wiring pattern 9a (first wiring portion) and the two lead wiring patterns 9b (second wiring portion) are formed on chip mounting region 14 via the insulating film. The chip wiring pattern 9a corresponds to the back electrode (first electrode) of the semiconductor chip 2 and has the back electrode lead 3a. The front electrode wiring pattern 9b corresponds to the front electrode (second electrode) of the semiconductor chip 2 and has the front electrode lead 3b. The semiconductor chip 2 is placed on the chip wiring pattern 9a so that the back electrode of the semiconductor chip 2 is connected to the chip wiring pattern 9a. The front electrode of the semiconductor chip 2 is electrically connected to the front electrode wiring pattern 9b via a bonding wire 4. The semiconductor chips 2 are covered by the silicon resin (not shown) similarly to the first embodiment.

The empty portion 14b whereon the semiconductor chip 2 is not mounted is cut off from the general-purpose heat sink 15, thereby making a secondary semiconductor member having the heat sink 16 whereon the three semiconductor chips 2 are mounted. Connecting the secondary semiconductor member to the external heat sink by a method similar to that of the third embodiment and applying a predetermined treatment to the secondary semiconductor device member completes the semiconductor device of fourth embodiment.

The semiconductor device of this embodiment can also be used without connecting to the external heat sink.

What is claimed is:

1. A semiconductor device comprising N pieces or less of a semiconductor chip mounted on a common substrate for mounting N pieces of said semiconductor chip, which comprises:

said semiconductor chip comprising a first surface on which a first electrode is formed and a second surface, opposite to said first surface, on which a second electrode is formed;

said common substrate being provided with a mounting main surface to be separated into N divisional chip mounting regions, each of said N divisional chip mounting regions having a first wiring area whereto said semiconductor chip is mounted and said first electrode of said semiconductor chip is electrically connected; a second wiring area, insulated from said first wiring area, whereto said second electrode of said semiconductor chip is electrically connected; and separating portions being positioned between said adjacent N divisional chip mounting regions;

wherein N pieces or less of said semiconductor chip are mounted on said corresponding first wiring areas of said common substrate respectively so that said first wiring area and said first electrode of said semiconductor chips make contact with each other, said second electrode of said semiconductor chips and said second wiring portion are electrically connected by wire bonding; and a redundant region whereon no semiconductor chip is mounted is cut off from said common substrate.

2. The semiconductor device according to claim 1, wherein said common substrate is an insulating thick film substrate.

3. The semiconductor device according to claim 2, wherein said separating area is a scribe line; and, cutting off across said scribe line to separate a useful portion whereon said semiconductor chips are mounted and said redundant portion which is one or more chip mounting regions adjacent to said useful portion, so that only said useful portion which is a part of said insulating thick film substrate is used as said common substrate.

4. The semiconductor device according to claim 2, wherein said insulating thick film is bonded onto an external heat sink by means of an adhesive.

5. The semiconductor device according to claim 1, wherein said common substrate is a conductive heat sink, said separating area is a fine wire portion connecting said adjacent chip mounting regions; and, cutting off said fine wire portion which connects said useful portion whereon said semiconductor chips are mounted and said redundant portion which is one or more said chip mounting regions adjacent to said useful portion thereby separating said useful portion and said redundant portion, so that only said useful portion which is a part of said heat sink is used as said common substrate.

6. The semiconductor device according to claim 5, wherein said first and second wiring portions are wiring patterns formed on said chip mounting region of said heat sink via an insulating film.

7. The semiconductor device according to claim 5, wherein at least one of said separating area which separate said chip mounting region adjacent said useful portion comprises a plurality of fine lines, a region between said fine lines is a screw hole; and connecting said common substrate onto said external heat sink by means of a screw.

8. A semiconductor device comprising N pieces or less of a semiconductor chip mounted on a common substrate for mounting N pieces of said semiconductor chip, which comprises:

said semiconductor chip comprising a first surface on which a first electrode is formed and a second surface, opposite to said first surface, on which a second electrode is formed;

said common substrate being provided with a mounting main surface to be separated into N divisional chip mounting regions, each of said N divisional chip mounting regions having a first wiring area whereto said semiconductor chip is mounted and said first electrode of said semiconductor chip is electrically connected; and separating portions being positioned between said adjacent N divisional chip mounting regions;

wherein N pieces or less of said semiconductor chip are mounted on said corresponding first wiring areas of said common substrate respectively so that said first wiring area and said first electrode of said semiconductor chips make contact with each other, while a second wiring portion which is electrically connected to said second electrode of said semiconductor chip is formed separately from said chip mounting region;

said semiconductor chip and said second wiring portion whereto said semiconductor chip is connected being sealed as a block of one chip mounting region by molding on said chip mounting region whereon said semiconductor chip is mounted; and, a redundant chip mounting region whereon no semiconductor chip is mounted being cut off via said separating area from said common substrate.

* * * * *